(12) United States Patent
Sun

(10) Patent No.: US 9,101,073 B2
(45) Date of Patent: Aug. 4, 2015

(54) SERVER CABINET

(71) Applicant: HON HAI PRECISION INDUSTRY CO., LTD., New Taipei (TW)

(72) Inventor: Zheng-Heng Sun, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 166 days.

(21) Appl. No.: 13/754,858

(22) Filed: Jan. 30, 2013

(65) Prior Publication Data

US 2014/0185246 A1  Jul. 3, 2014

(51) Int. Cl.
*H05K 7/18* (2006.01)
*H05K 7/14* (2006.01)

(52) U.S. Cl.
CPC .............. *H05K 7/18* (2013.01); *H05K 7/1488* (2013.01)

(58) Field of Classification Search
CPC ............................... H05K 7/18; H05K 7/1488
USPC ........ 248/201; 361/726, 724; 312/333, 223.2, 312/334.7, 34.44, 334.46
See application file for complete search history.

(56) References Cited

U.S. PATENT DOCUMENTS

| | | | | |
|---|---|---|---|---|
| 6,099,098 A | * | 8/2000 | Leong | 312/333 |
| 6,929,336 B2 | * | 8/2005 | Liu et al. | 312/223.1 |
| 8,240,490 B2 | * | 8/2012 | Malekmadani | 211/188 |
| 2002/0100847 A1 | * | 8/2002 | Lopez | 248/201 |
| 2011/0180497 A1 | * | 7/2011 | Zhang | 211/26 |
| 2013/0163167 A1 | * | 6/2013 | Liao | 361/679.02 |
| 2014/0159554 A1 | * | 6/2014 | Liu et al. | 312/223.2 |

* cited by examiner

*Primary Examiner* — Dion R Ferguson
*Assistant Examiner* — Mandeep Buttar
(74) *Attorney, Agent, or Firm* — Novak Druce Connolly Bove + Quigg LLP

(57) ABSTRACT

A server cabinet includes a rack, a server, a switch, and a first supporting member. The rack includes two columns located at a front end of the rack. The server is installed between the columns. The switch is installed in the rack above the server. Opposite ends of a front side of the switch are fastened to the columns of the rack. The first supporting member includes a connecting plate mounted to a rear side of the switch, and a supporting plate extending out from an end of the connecting plate and located below the switch. A raised portion protrudes down from the supporting plate. The raised portion is supported on the server.

4 Claims, 4 Drawing Sheets

SERVER CABINET

BACKGROUND

1. Technical Field

The present disclosure relates to a server cabinet.

2. Description of Related Art

In a server cabinet, a front end of a switch is generally fastened to a rack of the cabinet by screws. However, if the switch is long and heavy, a rear end of the switch may tilt and damage the bonding by screws between the front end of the switch unit and the cabinet.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
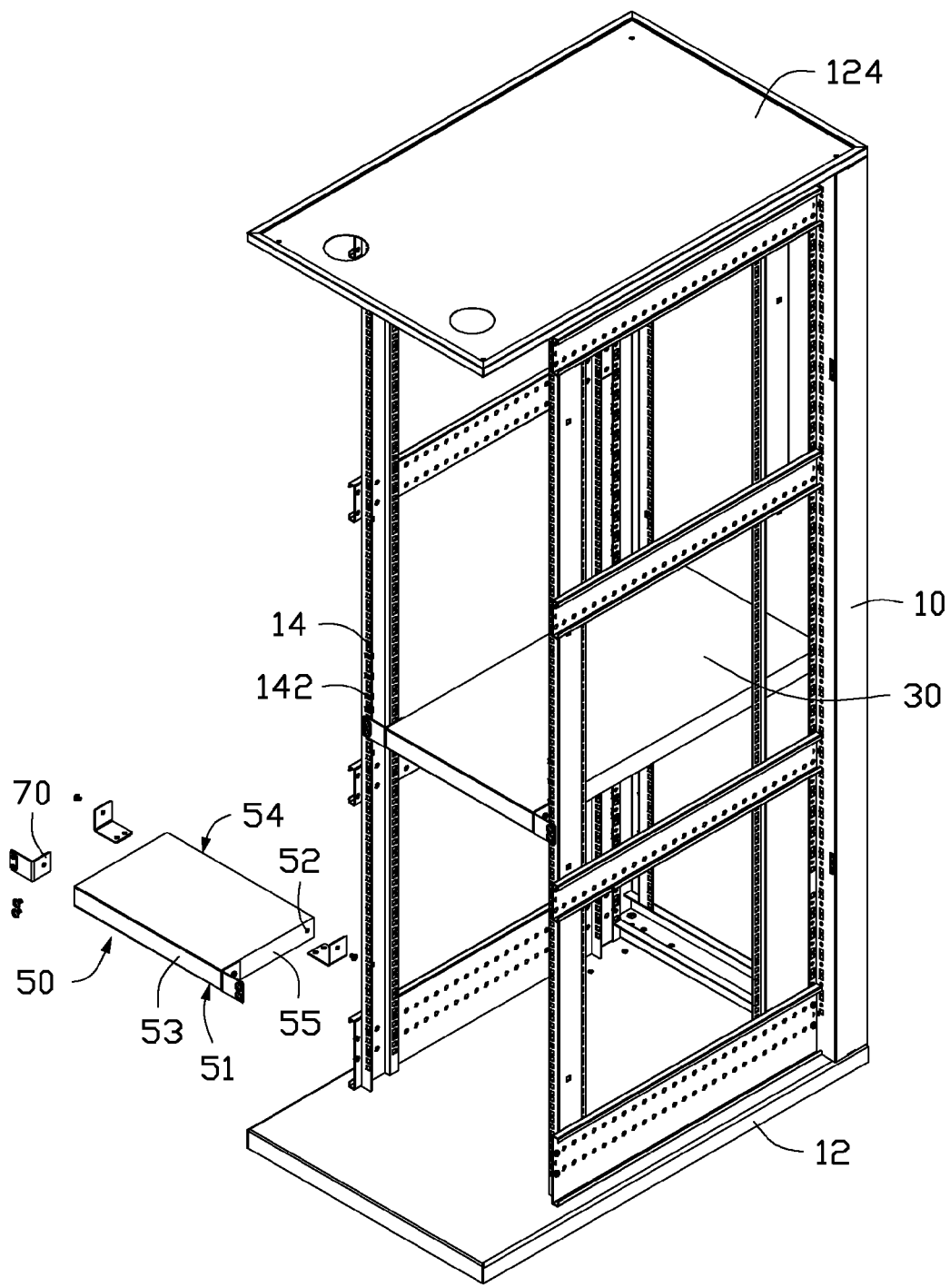
FIG. 1 is an exploded, isometric view of an exemplary embodiment of a server cabinet, wherein the server cabinet includes a plurality of supporting members.
Figure 2:
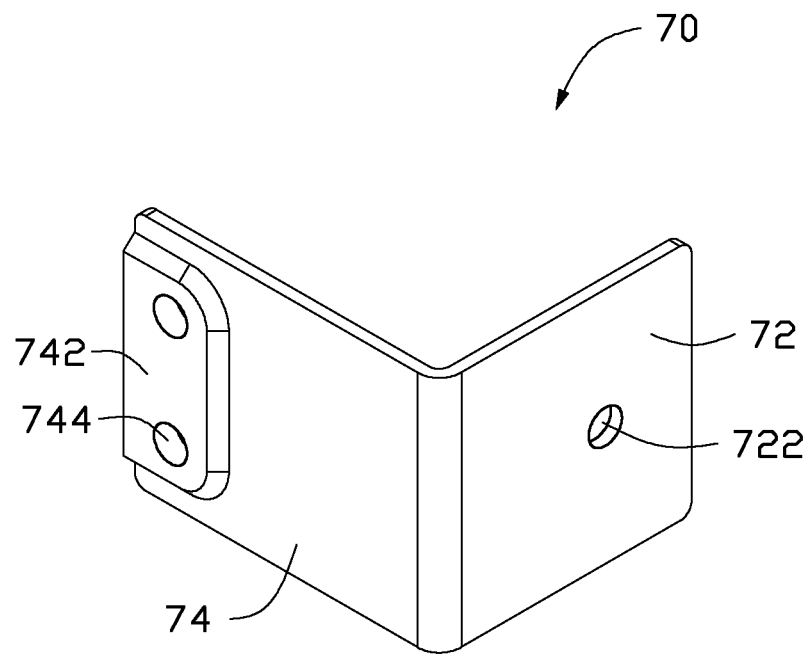
FIG. 2 is an enlarged view of one of the supporting members of FIG. 1.

FIG. 1 and FIG. 2 show an exemplary embodiment of a server cabinet. The server cabinet includes a rack 10, a server 30, a switch 50, and four supporting members 70.

The rack 10 includes a rectangular base 12, four vertical columns 14 located at four corners of the base 12, and a top wall 124 supported on top ends of the columns 14. Each column 14 defines a plurality of positioning holes 142 arrayed along a lengthwise direction of the column 14. The server 30 is installed among the columns 14.

The switch 50 includes a bottom wall 51, a front wall 53 perpendicularly extending up from a front side of the bottom wall 51, a rear wall 54 perpendicularly extending up from a rear side of the bottom wall 51 opposite to the front wall 53, and two end walls 55 extending up from two opposite ends of the bottom wall 51 and connected between the front wall 53 and the rear wall 54. Each sidewall 55 defines two screw holes 52 respectively adjacent to the front wall 53 and the rear wall 54.

Each supporting member 70 includes a connecting plate 72 and a supporting plate 74 perpendicularly extending from an end of the connecting plate 72. A raised portion 742 protrudes out from an end of the supporting plate 74 away from the connecting plate 72. The raised portion 742 defines two through holes 744. A middle of the connecting plate 72 defines a connecting hole 722.

Figure 3:
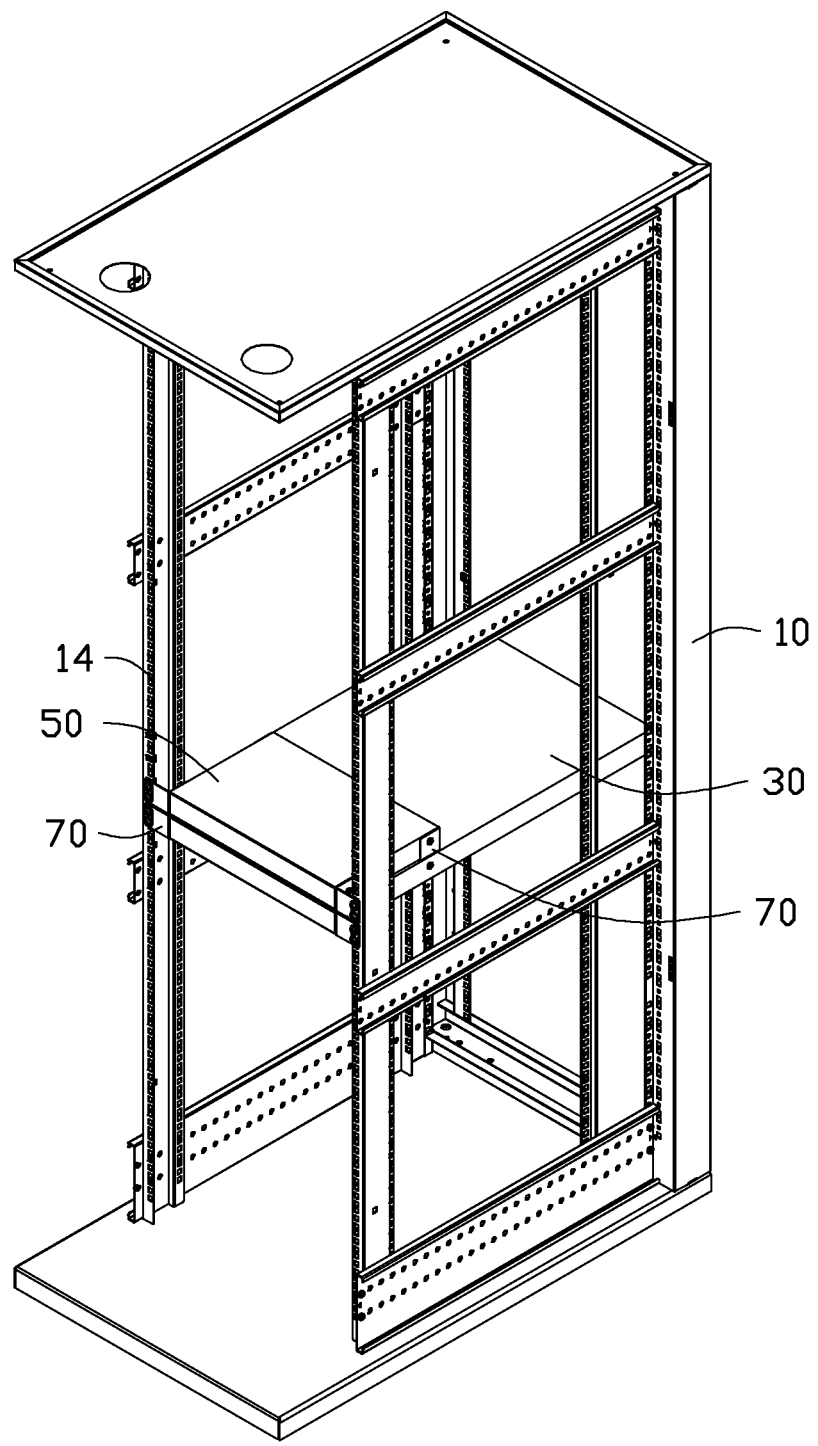
FIG. 3 is an assembled, isometric view of the server cabinet of FIG. 1.
Figure 4:
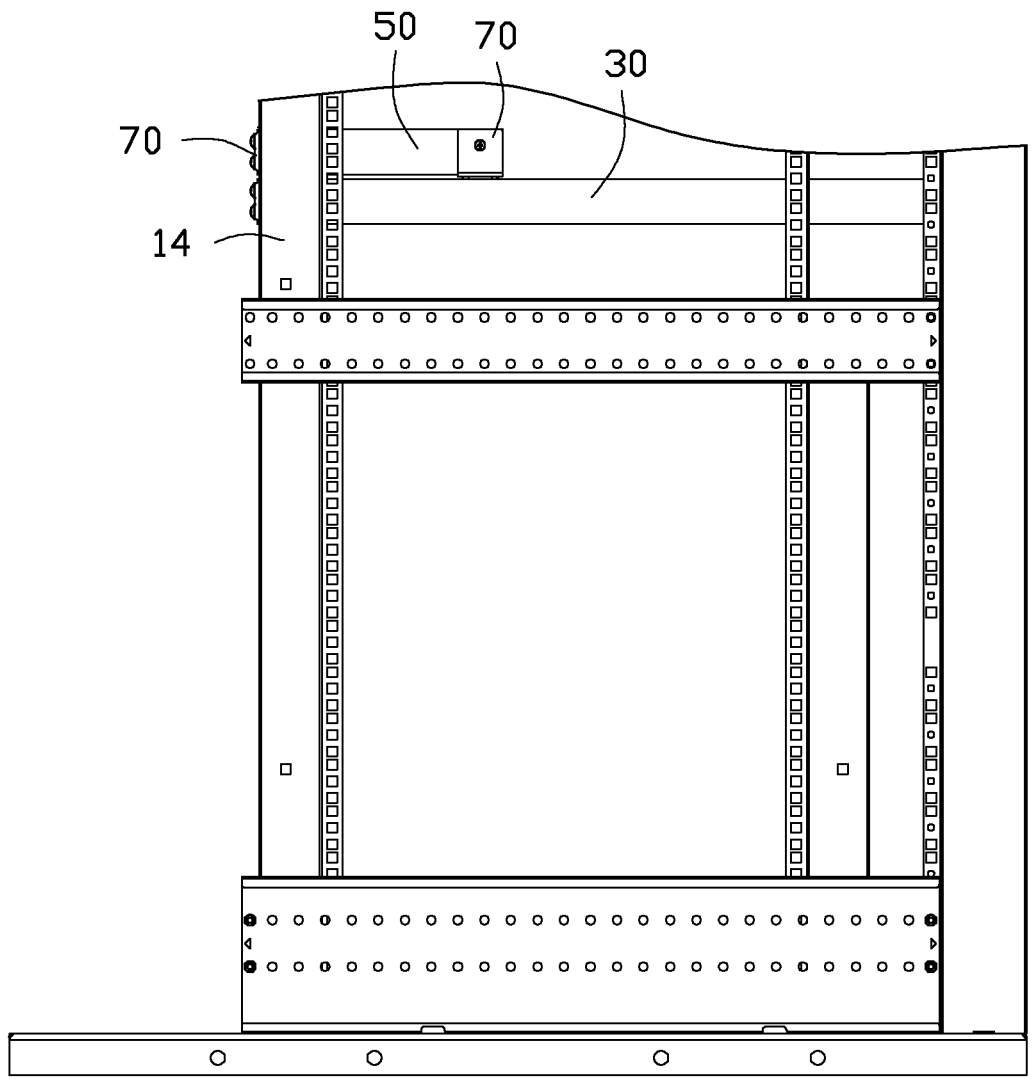
FIG. 4 is a side plan view of FIG. 3.

FIG. 3 and FIG. 4 show in assembly. Outer surfaces of the connecting plates 72 of two supporting members 70 opposite to the supporting plates 74 are abutted against the end walls 55 of the switch 50 adjacent to the front wall 53, to allow the supporting plate 74 of each supporting member 70 coplanar with the front wall 53. Two screws extend through the connecting holes 722, to be screwed into the corresponding screw holes 52 adjacent to the front wall 53. Therefore, the two supporting members 70 are adjacent to the front wall 53 of the switch 50. Inner surfaces of the connecting plate 72 of the other two supporting members 70 facing the supporting plates 74 are abutted against the end walls 55 adjacent to the rear wall 54, to allow inner surfaces of the supporting plates 74 facing the connecting plates 72 to abut against the bottom wall 51. Two screws extend through the connecting holes 722, to be screwed into the corresponding screw holes 52 adjacent to the rear wall 54. Therefore, the other two supporting members 70 are adjacent to the rear wall 54 of the switch 50.

A combination of the switch 50 and the supporting members 70 is installed to the rack 10. The rear wall 54 of the switch 50 is inserted into the rack 10 from a front end of the rack 10. The switch 50 is slid rearward on the server 30 until the supporting plates 74 of the two supporting members 70 adjacent to the front wall 53 abut against the columns 14. The raised portions 742 of the other two supporting members 70 are sandwiched between the switch 50 and the server 30. Four screws extend through the through holes 744, to be screwed into the corresponding positioning holes 142. The front side of the switch 50 is mounted to the front end of the rack 10 through the two supporting members 70, and the rear end of the switch 50 is supported on the server 30 through the raised portions 742 of the other two supporting members 70.

Even though numerous characteristics and advantages of the embodiments have been set forth in the foregoing description, together with details of the structure and the functions of the embodiments, the disclosure is illustrative only, and changes may be made in details, especially in the matters of shape, size, and arrangement of parts within the principles of the embodiments to the full extent indicated by the broad general meaning of the terms in which the appended claims are expressed.

What is claimed is:

1. A server cabinet, comprising:
a rack comprising two columns located at a front end of the rack;
a server installed between the columns;
a switch installed in the rack and above the server; and
a plurality of supporting members, wherein each supporting member comprises a connecting plate and a supporting plate extending out from an end of the connecting plate, a raised portion protruding down from the supporting plate, some supporting members are attached to the switch, wherein the connecting plates of the supporting members are mounted to a rear side of the switch, the supporting plates of the supporting members are located below the switch, the raised portions of the supporting members are supported on the server; some supporting members are respectively connected between the two columns and two opposite sides of the front end of the switch, wherein the connecting plates of the supporting members are fixed to the switch, and the raised portions of the supporting plates of the supporting members are installed to the two columns.

2. The server cabinet of claim 1, wherein the two opposite sides of the front end of the switch respectively defines a screw hole, the connecting plates of the supporting members respectively defines a connecting hole, some screws extend through the connecting holes of the supporting members and are screwed into the screw holes of the switch.

3. The server cabinet of claim 1, wherein the supporting plates of the supporting members respectively define two through holes, some screws extend through the through holes and are screwed into the columns.

4. The server cabinet of claim 1, wherein the rear side of the switch defines some screw holes, the connecting plates of the supporting members define some connecting holes, some screws extend through the connecting holes of the supporting members and are screwed in the screw holes of the switch.

\* \* \* \* \*